United States Patent
Cheng et al.

(10) Patent No.: US 8,289,388 B2
(45) Date of Patent: Oct. 16, 2012

(54) ALIGNMENT METHOD FOR SINGULATION SYSTEM

(75) Inventors: Chi Wah Cheng, New Territories (HK); Lap Kei Chow, Kowloon (HK)

(73) Assignee: ASM Assembly Automation Ltd, Hong Kong (HK)

( * ) Notice: Subject to any disclaimer, the term of this patent is extended or adjusted under 35 U.S.C. 154(b) by 603 days.

(21) Appl. No.: 12/465,766

(22) Filed: May 14, 2009

(65) Prior Publication Data
US 2010/0289889 A1    Nov. 18, 2010

(51) Int. Cl.
*H04N 7/18* (2006.01)
(52) U.S. Cl. .......................................... 348/95
(58) Field of Classification Search ............... 348/95
See application file for complete search history.

(56) References Cited

U.S. PATENT DOCUMENTS

| | | | | |
|---|---|---|---|---|
| 5,132,911 A | * | 7/1992 | Leader et al. | 700/114 |
| 5,621,813 A | * | 4/1997 | Brown et al. | 382/151 |
| 5,696,835 A | * | 12/1997 | Hennessey et al. | 382/141 |
| 5,943,089 A | * | 8/1999 | Douglas | 348/87 |
| 6,826,986 B2 | | 12/2004 | Lim et al. | |
| 2002/0184982 A1 | | 12/2002 | Smith et al. | |

* cited by examiner

*Primary Examiner* — Kristie Shingles
(74) *Attorney, Agent, or Firm* — Ostrolenk Faber LLP

(57) ABSTRACT

A method for determining virtual cutting lines for a substrate prior to its singulation is provided whereby the substrate comprises first and second rows of alignment marks which are substantially parallel to each other such that a pair of alignment marks each from the first and second rows of alignment marks is configured for determining a position of a virtual cutting line. The method comprises the steps of positioning the first row of alignment marks along a relative motion path of a first camera and positioning the second row of alignment marks along a relative motion path of a second camera. While the substrate is being moved relative to the first and second cameras along the respective relative motion paths without stopping, the first and second cameras capture images of multiple pairs of alignment marks from the first and second rows of alignment marks during such motion. Thereafter, the position of each virtual cutting line is determined from the images of each pair of alignment marks along the first and second rows of alignment marks relating to the virtual cutting line and stored in a storage device for use during singulation.

8 Claims, 8 Drawing Sheets

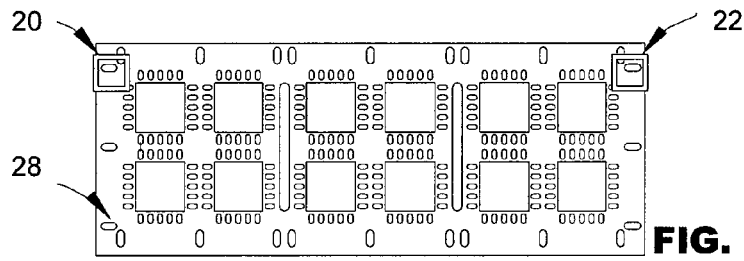
FIG. 5A
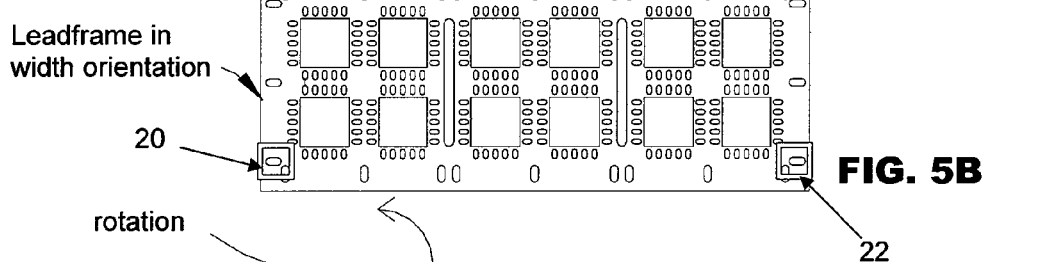
FIG. 5B
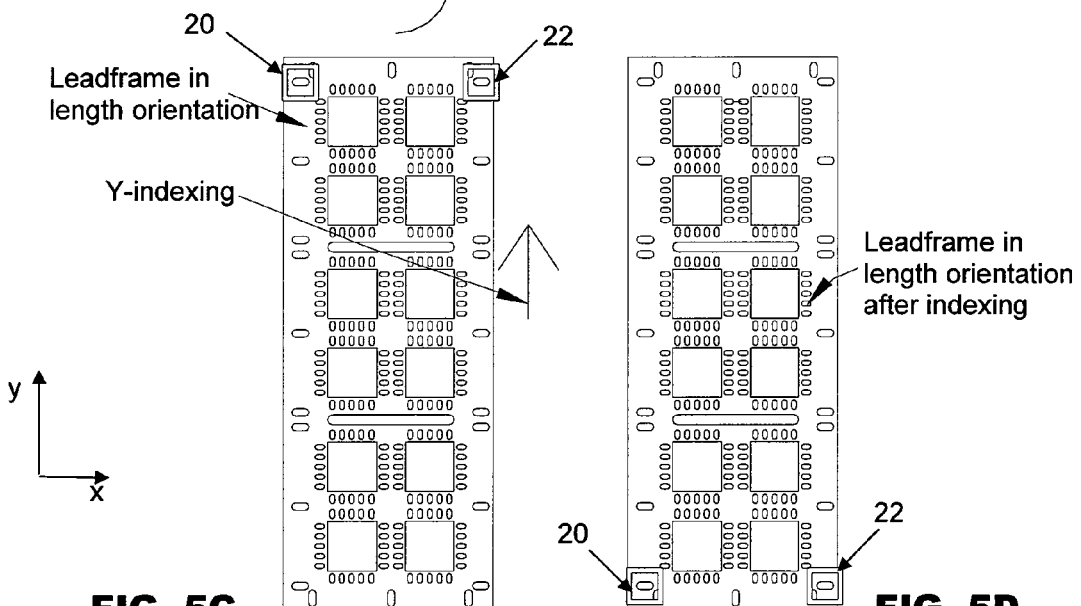
FIG. 5C    FIG. 5D
(Prior Art)

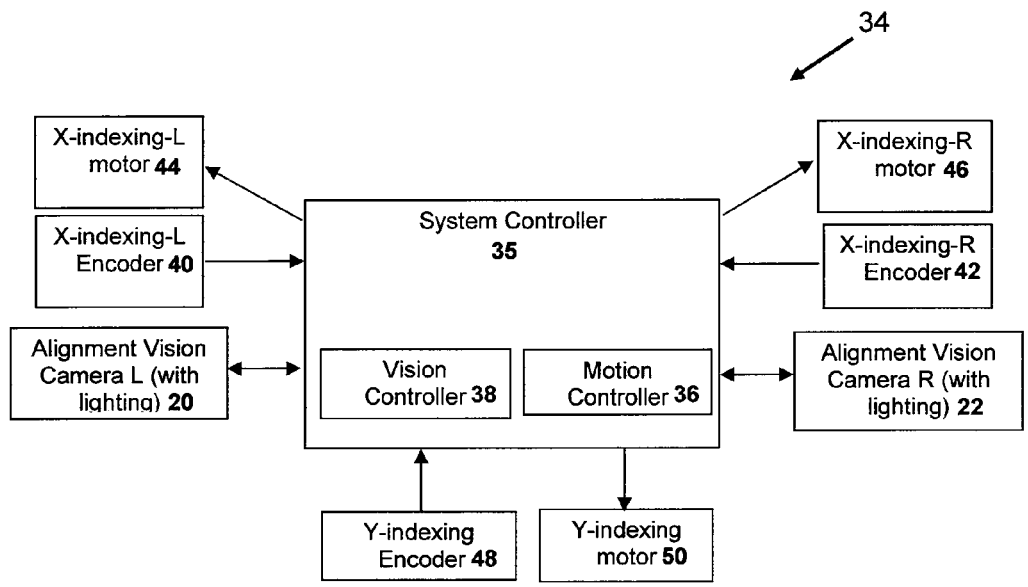
FIG. 9
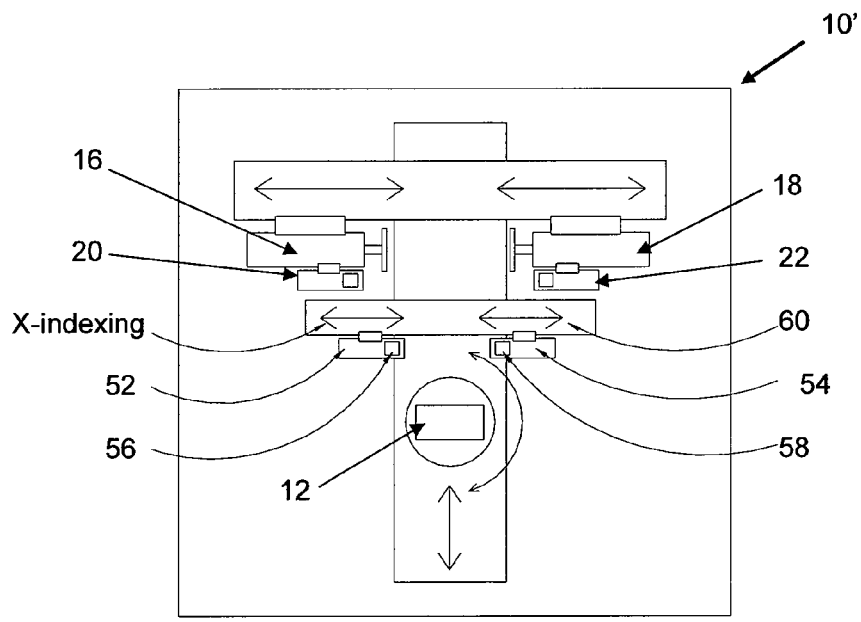
FIG. 10
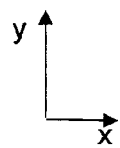

ALIGNMENT METHOD FOR SINGULATION SYSTEM

FIELD OF THE INVENTION

The present invention relates to a singulation system for cutting and separating electronic components, and in particular, to a singulation system incorporating pattern recognition alignment for aligning the electronic components prior to singulation.

BACKGROUND AND PRIOR ART

A sawing system for singulating or dicing electronic components, such as semiconductor substrates or packaged semiconductor devices on substrates, comprises at least a spindle system including a sawing blade and a carrier support such as a chuck table. The motion axis of the spindle system is orthogonal to the motion axis of the chuck table and a theta axis table is located on top of the chuck table. The spindle system typically includes either one or two high-speed rotating shafts with a sawing blade each. In a dual spindle system, two parallel spindles are arranged either facing each other or next to each other facing the same direction.

Dicing may be performed on the semiconductor substrate in one direction by moving the chuck table under a spindle axis while the sawing blade is cutting the semiconductor substrate on a carrier, such as a saw jig, on the theta axis table of the chuck table. The spindle axis may index line by line to cut along all the cutting lines required in one direction. Next, the theta table on the chuck table rotates 90 degrees about the theta axis to perform dicing in a direction orthogonal to the first direction. Accordingly, the semiconductor substrate is singulated into rectangular units.

FIGS. 1 to 3 are plan views of samples of semiconductor substrates which need to be diced along cutting lines. FIG. 1 illustrates a leadframe with two types of alignment marks 101, 103 along its cutting lines. In another leadframe as shown in FIG. 2, alignment marks are located about the cutting lines. The cutting lines are virtual cut lines 105, 107 along the length and width of the leadframe. As there is a predetermined dimensional relationship with the virtual cutting lines, the cutting lines can be determined after recognizing the corresponding alignment marks. FIG. 3 shows a map of virtual cutting lines on a wafer which are denoted as cutting lines 109, 111.

For more accurate dicing, a pattern recognition (PR) camera is mounted on the spindle axis to recognize the alignment marks such as those shown in FIGS. 1 to 3 on the semiconductor substrate before dicing. In this way, accurate dicing can be achieved by determining an alignment of the substrate and adjusting its offset in the X-Y-θ axes prior to dicing. There is however a drawback in using a PR camera mounted on the spindle axis in that the working sequence from substrate loading, PR alignment, dicing to unloading has to be sequential. This prolongs the cycle time for dicing a substrate.

One way to reduce the cycle time is to have a separate vision station for PR alignment. The separate station is located either at one end of a sawing zone or in between the sawing zone and a loading/unloading zone. A disadvantage of this approach is that the water for cooling the sawing blades and for washing away the debris from dicing the second substrate may contaminate the first substrate as it passes through the sawing zone. Another disadvantage is that an additional motion axis is required for the separate vision station. This means increased costs and space required for incorporating an additional chuck table and the related mechanisms to move the chuck table along that axis. Furthermore, cycle time is increased as each semiconductor substrate has to move some distance from the substrate loading/unloading station to the vision alignment zone for alignment before dicing. One prior art which uses the sawing system described above is US Patent Publication No. 2002/0184982 entitled "Bidirectional Singulation Saw and Method".

Another prior art example of a sawing system is disclosed in U.S. Pat. No. 6,826,986 entitled "Bi-directional Singulation System and Method" which has a separate vision system for PR alignment. Unlike the aforesaid sawing system, the vision alignment zone of the sawing system is located between the sawing zone and the loading/unloading zone. Thus, the substrates do not have to pass through the sawing zone for vision alignment at the vision alignment zone. In this way, the substrates are not contaminated by water and debris in the sawing zone. This system also has the disadvantages of having an additional motion axis for moving the work chucks to the separate vision alignment zone and that the semiconductor substrates are still required to move some distance from the substrate loading/unloading station to the vision alignment zone for positioning before dicing.

FIG. 4 is a plan view of an exemplary singulation system 10 in the prior art which does not require an additional motion axis for moving a chuck table to a separate vision alignment zone. The singulation system 10 comprises two cameras. Each camera is mounted and carried on a spindle axis next to a cutting blade. A substrate 12 which is to be singulated is placed onto a rotary chuck table 14 positioned below a first spindle 16 and a second spindle 18. The substrate 12 moves in a Y-axis below and across the X-axes of the first and second spindles 16, 18. A first alignment vision camera 20 and a second alignment vision camera 22 are mounted respectively on the first and second spindles 16, 18. The first alignment vision camera 20 and the second alignment vision camera 22 have first and second viewfinders 24, 26 respectively for capturing images of the substrate 12. The cameras can be adjusted along the X-axes of the first and second spindles 16, 18 for locating the alignment markings on the substrate 12. The chuck table 14 is rotatable to position the substrate 12 in another orientation for indexing the substrate 12 along the Y-axis for viewing by the cameras.

FIGS. 5A to 5D are plan views of a leadframe 28 showing a conventional method for pattern recognition (PR) alignment of the leadframe 28 on the chuck table 14 by "stop and grab" means using the singulation system 10 of FIG. 4. The leadframe 28 is positioned in a first or width orientation as shown in FIG. 5A. The first and second cameras 20, 22 move to positions in the X-direction along the first and second spindles such that their field of views (FOVs) may locate a first pair of alignment marks at the top two corners of the leadframe 28, and then "grab" or capture the images of the marks. In FIG. 5B, the chuck table 14 moves in the Y-direction and transports the leadframe 28 to a position where the first and second cameras 20, 22 may locate in their FOVs a second pair of alignment marks which are at the bottom corners of the leadframe 28 before capturing the images of the marks.

FIG. 5C shows the leadframe 28 in a second or length orientation after it has been rotated 90° by the chuck table 14. The PR alignment process may be repeated as in FIG. 5A for the top pair of alignment marks along the length of the leadframe 28. Next, the chuck table 14 moves in the Y-direction and transports the leadframe 28 to another position, as shown in FIG. 5D, so that the bottom pair of alignment marks fall within the FOVs of the cameras which locate the alignment marks accordingly as in FIG. 5B. Once sufficient information has been collected of the corner alignment marks, the positions and orientations of the cutting lines on the leadframe 28 can be estimated and stored for the cutting operation.

FIG. 6 illustrate plan views of a wafer 28' which show the conventional "stop and grab" means according to FIGS. 5A to 5D to perform PR alignment on a wafer 28' using the singulation system 10 of FIG. 4. As this method of PR alignment again involves stopping the chuck table before capturing the images, cycle time is comparatively long. Therefore, it would be desirable to shorten the cycle time of the singulation process.

SUMMARY OF THE INVENTION

It is thus an object of this invention to seek to provide a vision-assisted alignment method for a singulation system which allows for the determination of cutting lines of substrates with reduced cycle time, space requirements and costs as compared to the aforesaid prior art.

Accordingly, the invention provides a method for determining cutting lines for a substrate prior to its singulation, the substrate comprising first and second rows of alignment marks which are substantially parallel to each other, a pair of alignment marks each from the first and second rows of alignment marks being configured for determining a position of a cutting line, the method comprising the steps: of positioning the first row of alignment marks along a relative motion path of a first camera and positioning the second row of alignment marks along a relative motion path of a second camera; moving the substrate relative to the first and second cameras along the respective relative motion paths without stopping while the first and second cameras capture images of multiple pairs of alignment marks from the first and second rows of alignment marks during such motion; and thereafter determining the position of each cutting line from the images of each pair of alignment marks along the first and second rows of alignment marks relating to the cutting line, and storing the positions of the cutting lines in a storage device for use during singulation.

It would be convenient hereinafter to describe the invention in greater detail by reference to the accompanying drawings which illustrate the preferred embodiments of the invention. The particularity of the drawings and the related description is not to be understood as superseding the generality of the broad identification of the invention as defined by the claims.

BRIEF DESCRIPTION OF THE DRAWINGS

The present invention will be readily appreciated by reference to the detailed description of the preferred embodiments of the invention when considered with the accompanying drawings, in which:

FIGS. 5A to 5D are plan views of a leadframe showing a conventional method of pattern recognition (PR) alignment of the leadframe on a chuck table by "stop and grab" means using the singulation system of FIG. 4;

FIG. 9 shows a basic configuration of an electronic system using the singulation system illustrated in the method according to the first preferred embodiment of the invention;

FIG. 10 is a plan view of a singulation system with four cameras for pattern recognition (PR) alignment of a substrate using an on-the-fly PR alignment method according to the second preferred embodiment of the invention.

DETAILED DESCRIPTION OF THE PREFERRED EMBODIMENTS OF THE INVENTION

The preferred embodiments of the present invention will be described hereinafter with reference to the accompanying drawings.

Figure 1:
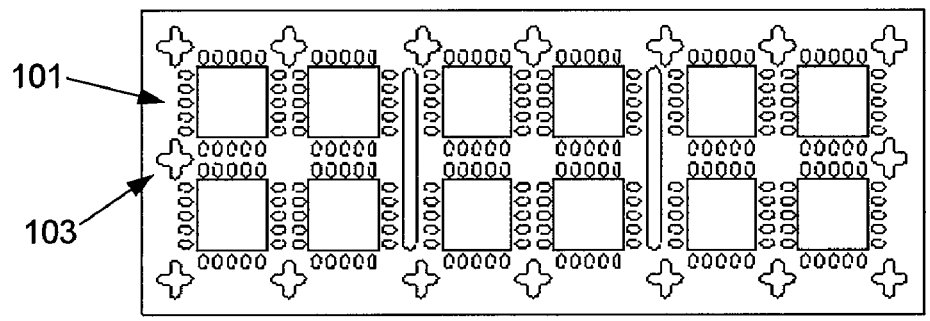
FIG. 1 is a plan view of a leadframe illustrating the leadframe with two types of alignment marks along its cutting lines.
Figure 2:
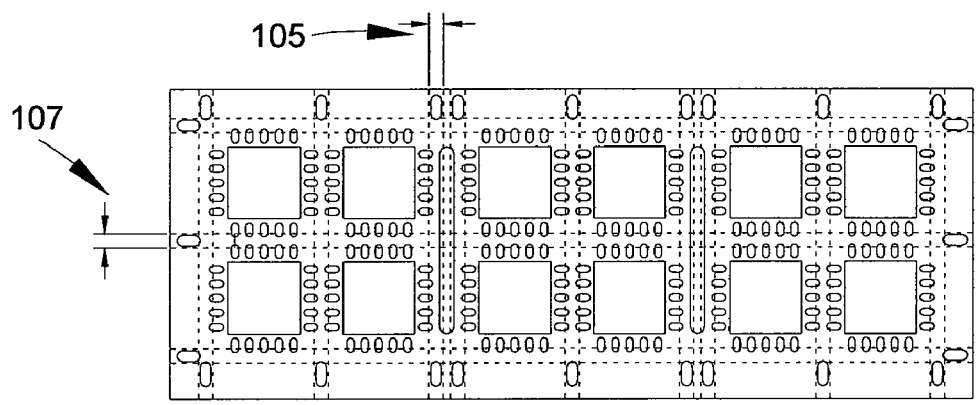
FIG. 2 is a plan view of a leadframe illustrating alignment marks which are located about the cutting lines.
Figure 3:
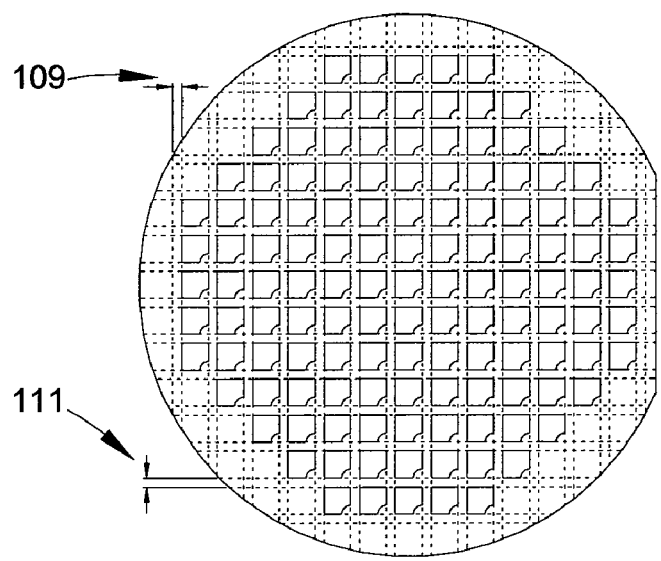
FIG. 3 is a plan view of a wafer showing a map of cutting lines on the wafer.
Figure 4:
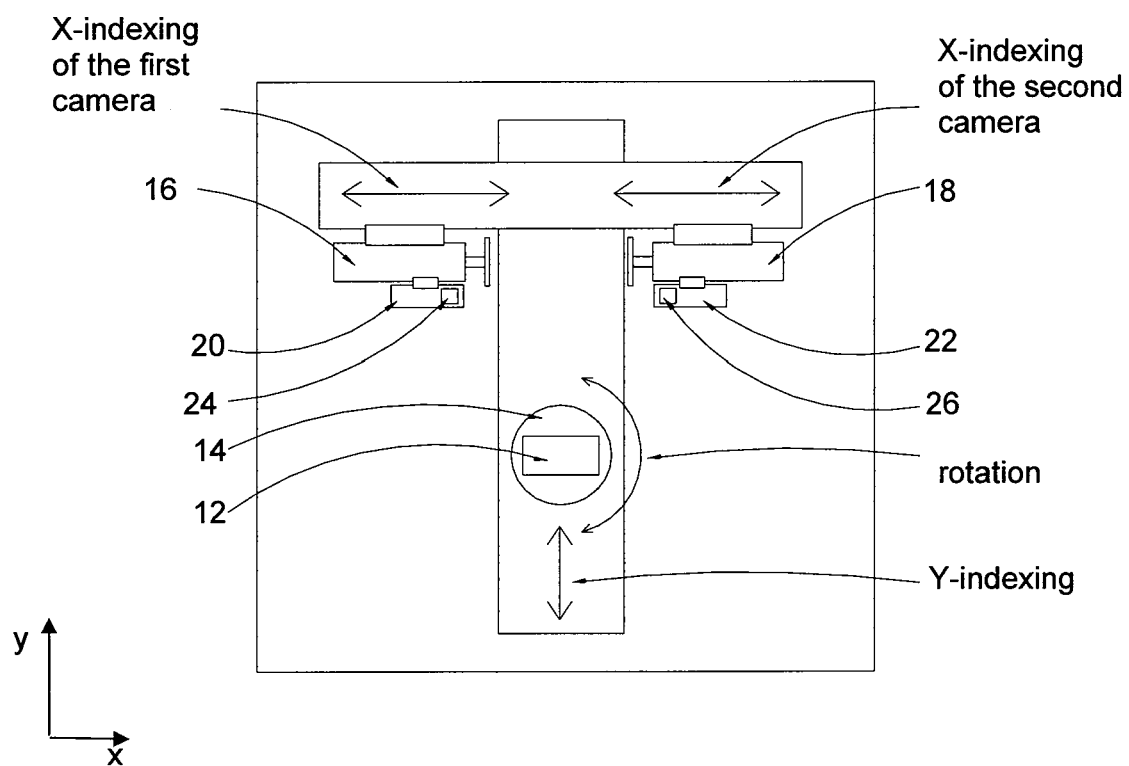
FIG. 4 is a plan view of an exemplary singulation system in the prior art which does not require an additional motion axis for moving chuck tables to a separate vision alignment zone.
Figure 6:
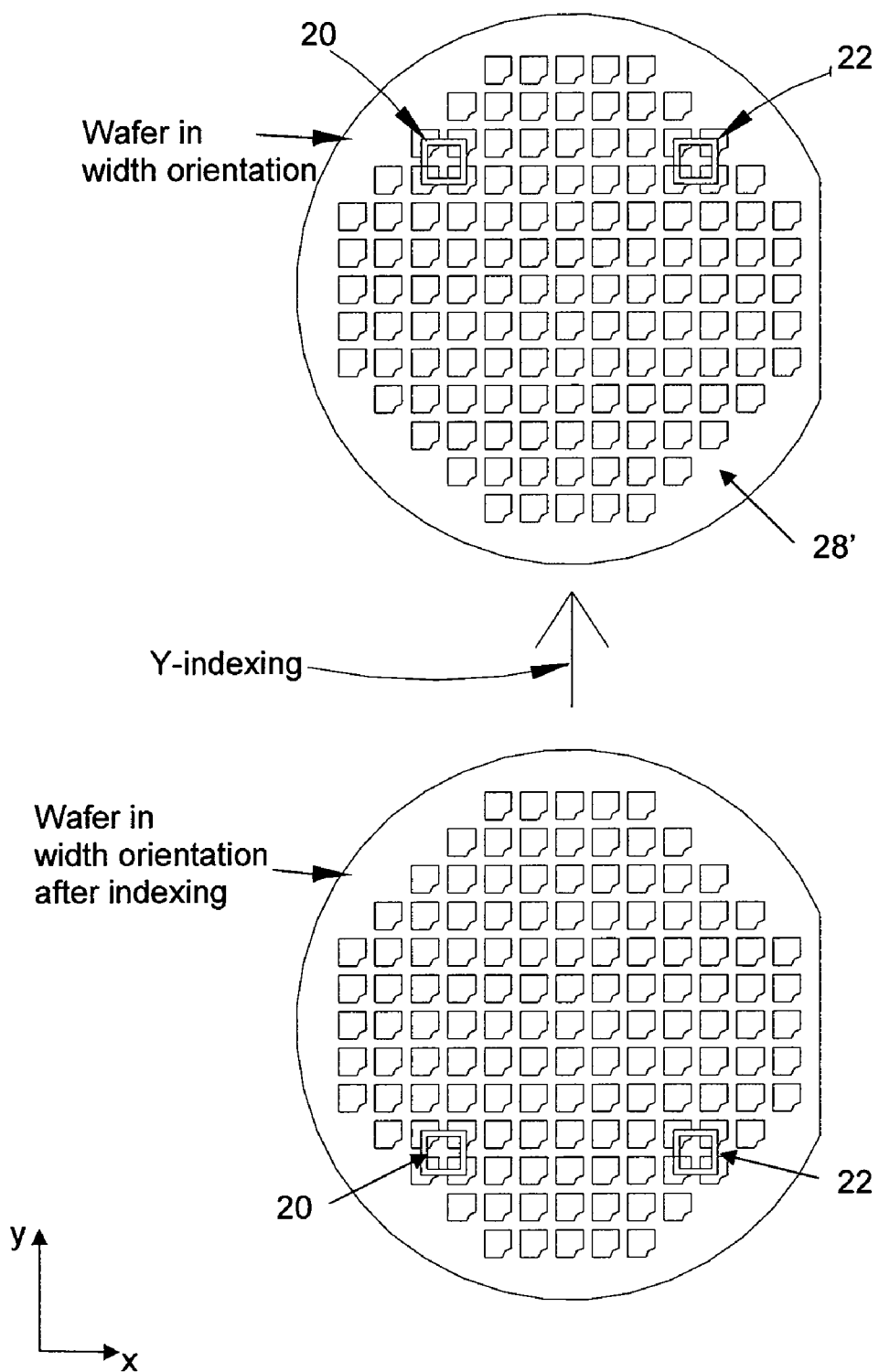
FIG. 6 are plan views of a wafer which show the conventional "stop and grab" means according to FIGS. 5A to 5D to perform PR alignment on a wafer using the singulation system of FIG. 4.
Figure 7A:
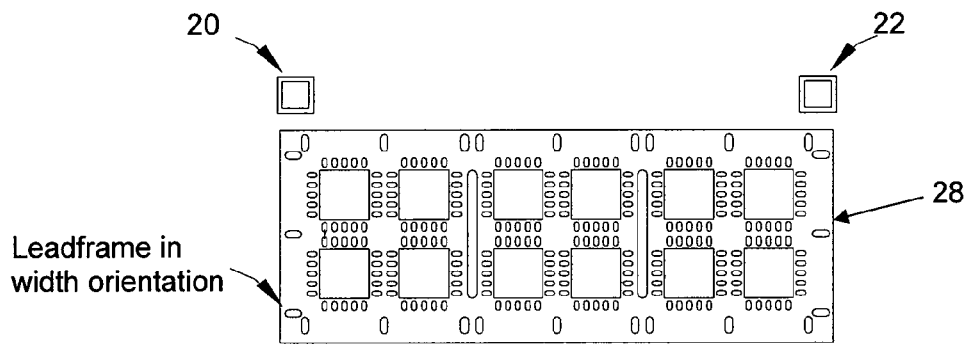
FIGS. 7A to 7C are plan views of a leadframe and first and second cameras which illustrate on-the-fly pattern recognition (PR) alignment of a substrate using dual cameras according to the first preferred embodiment of the invention.
Figure 7B:
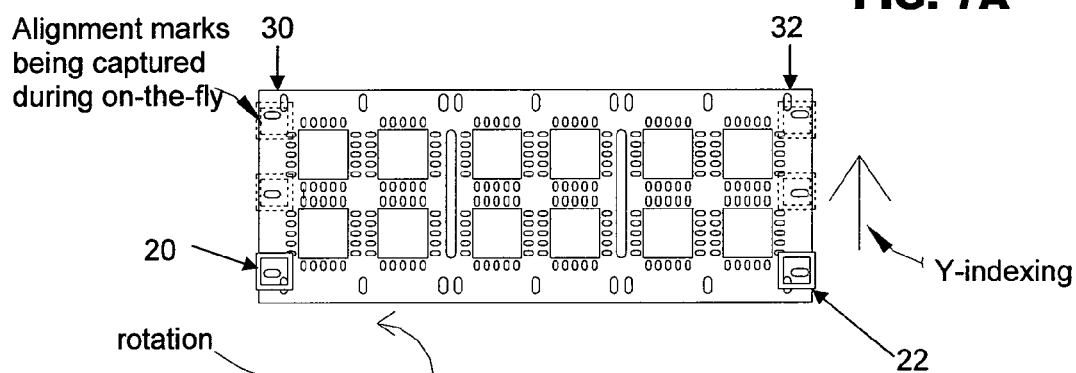
Figure 7C:
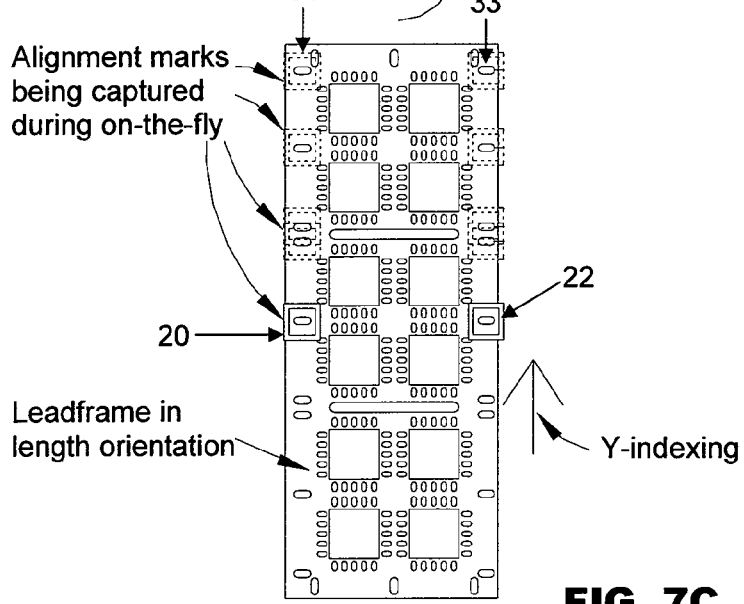

FIGS. 7A to 7C are plan views of a leadframe 28 and first and second cameras 20, 22 which illustrate on-the-fly pattern recognition (PR) alignment of a substrate using dual cameras according to the first preferred embodiment of the invention. The leadframe 28, which comprises first and second rows 30, 32 of alignment marks parallel to each other, is arranged in a first orientation as shown in FIG. 7A. The first and second cameras 20, 22 move independently to positions in the X-direction along relative motion axes of the first and second spindles 16, 18 above the leadframe 28 so that the field of views (FOVs) of the cameras may locate a first pair of alignment marks, which may be at the top two corners on the leadframe 28. Typically, there is a pair of alignment marks each from the first and second rows 30, 32 of alignment marks and located at the two opposite sides of the leadframe for determining a position of a cutting line. Capturing the images of this pair of alignment marks enables one to determine the positions of the starting and ending point, as well as the angle, of each cutting line.

In FIG. 7B, the first row 30 of alignment marks is positioned along a relative motion path of the first camera 20 while the second row 32 of alignment marks is positioned along a relative motion path of the second camera 22. The chuck table may move and index in the Y-direction underneath the first and second cameras 20, 22 and transport the leadframe 28 relative to the cameras along the relative motion paths without stopping such that the FOV of the first or left camera 20 can cover and capture the images of all the alignment marks along the left side of the leadframe 28, and the FOV of the second or right camera 22 can cover and capture the images of all the alignment marks along the right side of the leadframe 28. Therefore, images of multiple pairs of alignment marks from the first and second rows 30, 32 of alignment marks are captured by the cameras. In this way, the images of all imaged alignment marks on the two opposite sides of the leadframe 28 are captured by the first and second cameras 20, 22 cameras simultaneously during such motion in an on-the-fly (or non-stop) manner. As mentioned above, the images of each pair of alignment marks along the first and second rows 30, 32 of alignment marks relating to the cutting line determines the position of each cutting line. Positions of starting and ending points and angle of each and every cutting line of the substrate in the first orientation can thus be determined from the captured images. The positions of the cutting lines are then stored in a storage device for use during singulation.

FIG. 7C shows the leadframe 28 after it has been rotated 90° on the chuck table 14 to a second orientation. The first and second cameras 20, 22 are re-positioned in the X-direction corresponding to the positions at the top two corners at third and fourth rows 31, 33 of alignment marks on opposite sides of the leadframe 28 positioned in the second orientation. The third and fourth rows 31, 33 of alignment marks are parallel to each other and perpendicular to the first and second rows 30, 32 of alignment marks. The third row 31 of alignment marks is positioned along the relative motion path of the first camera 20 and the fourth row 33 of alignment marks is positioned along the relative motion path of the second camera 22. The leadframe 28 is operative to move relative to the first and second cameras 20, 22 along the respective relative motion paths without stopping while the first and second cameras 20, 22 capture images of multiple pairs of alignment marks from the third and fourth rows 31, 33 of alignment marks during its motion.

As with FIG. 7B, the images of all the imaged alignment marks on the two opposite sides of the leadframe 28 are captured on-the-fly when the leadframe 28 is at the second orientation while indexing the leadframe 28 in the Y-direction. The position of each cutting line from the images of each pair of alignment marks along the third and fourth rows 31, 33 of alignment marks relating to the cutting line can be determined. Positional and angular information of every cutting line is collected and calculated before cutting proceeds at the next stage. The positions of the cutting lines in this orientation can also be stored in a storage device for use during singulation. This on-the-fly method shortens the cycle time of pattern recognition, and as all the alignment marks are captured, accurate information on the cutting lines is obtained instead of by estimation as in the case of the prior art described in FIGS. 5A to 5D. Furthermore, having collected all the required positional and angular information for all cutting lines in the first and second orientations of the leadframe 28, accurate sawing may be conducted.

Figure 8A:
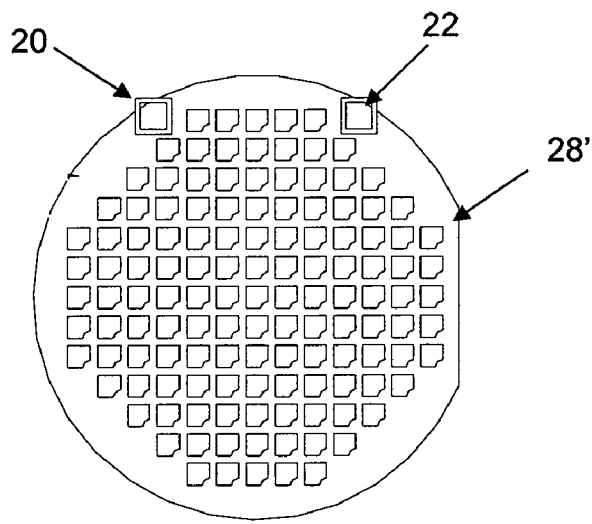
FIGS. 8A to 8C are plan views of a wafer and cameras showing on-the-fly PR alignment of a wafer using dual cameras according to the first preferred embodiment of the invention.
Figure 8B:
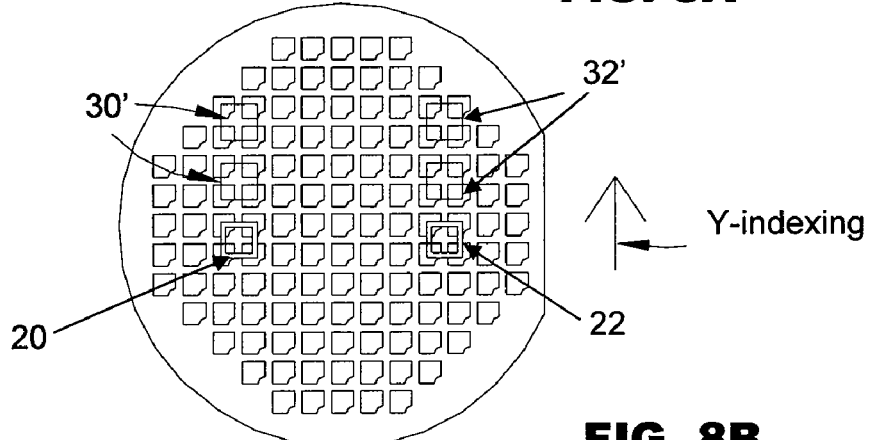
Figure 8C:
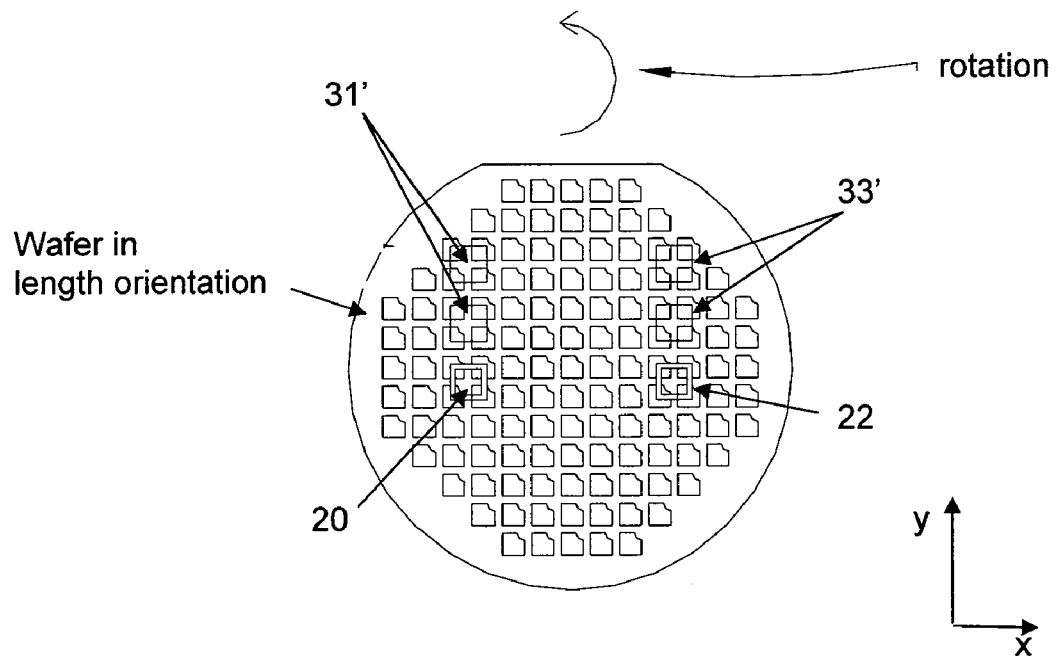

FIGS. 8A to 8C are plan views of a wafer 28' and cameras 20, 22 showing on-the-fly PR alignment of the wafer 28' using dual cameras according to the first preferred embodiment of the invention. For a substrate that is rectangular, the outermost alignment marks of the first and second rows 30, 32 of alignment marks located at opposite corners of the substrate are positioned in the fields of view of the first and second cameras 20, 22 respectively prior to moving the substrate relative to the cameras. They are farthest away from each other and offer the least error when calculating alignment. For a substrate which is round as in a wafer, two rows of alignment marks in a first orientation of the wafer which include a sufficient number of units and which are also sufficiently far away from each other are selected for PR alignment as shown in FIG. 8A. In FIG. 8B, the wafer 28' is indexed in the Y-direction such that the alignment marks on the first and second rows 30', 32' are respectively captured by the first and second cameras 20, 22. Likewise, FIG. 8C shows the wafer 28' in a second orientation after the wafer 28' has been rotated by 90°. The two rows 31', 33' of alignment marks selected are also sufficiently far away from each other to include a sufficient number of units in between.

FIG. 9 shows a basic configuration of an electronic system 34 using the singulation system 10 illustrated in the method according to the first preferred embodiment of the invention. A system controller 35 comprises a motion controller 36 and a vision controller 38. The system controller 35 communicates with the first spindle 16 and the first camera 20 mounted on the first spindle axis, as well as the second spindle 18 and the second camera 22 mounted on the second spindle axis. The system controller 35 also communicates with the chuck table 14. The motion controller 36 is activated to move the chuck table 14 carrying the substrate without stopping underneath the dual cameras 20, 22 in the Y direction. At the same time, the motion controller 36 sends signals to the vision controller 38 which captures images at predetermined positions of learnt alignment marks along the relative motion path of the first and second cameras 20, 22 with respect to the chuck table 14 that are in the FOVs of the first and second cameras 20, 22 with minimal delay to keep pace with the motion speed. The predetermined positions of the alignment marks are X and Y encoder positions registered and stored by first and second X-indexing encoders 40, 42 and a Y indexing encoder 48 as pre-learned positions prior to determining the cutting lines for the substrate. The first and second cameras 20, 22 are indexed in the X-direction by first and second X-indexing motors 44, 46 and the positions are registered as learned X encoder positions, and the chuck table 14 is indexed in the Y-direction by a Y-indexing motor 50 and the position of the chuck table 14 is registered with a Y-indexing encoder 48 as learned Y encoder positions.

A working sequence of the aforesaid electronic system 34 is described as follows. A user inputs basic parameters such as unit size of a substrate to be singulated, width, length and block pitch into the system. The user teaches the machine to learn and register the pattern of the alignment marks. By using the information input by the user, the system controller 35 is able to locate and record the positions of the alignment marks. During on-the-fly PR alignment, the system controller 35 triggers the first and second vision cameras 20, 22 to capture the images of the alignment marks when the chuck table 14 and the substrate 12 move to corresponding positions of the learned and registered alignment marks. Then, the actual positions of the alignment marks can be known. The system controller 35 uses such information to calculate the positions of the cutting lines.

FIG. 10 is a plan view of a singulation system 10' with four cameras for on-the-fly PR alignment of a substrate 12 according to the second preferred embodiment of the invention. Besides the first and second cameras 20, 22, third and fourth cameras 52, 54 with respective third and fourth viewfinders 56, 58, are mounted separately from the first and second spindles 16, 18 on an indexing mount 60 located in front of the said spindle axes. The third and fourth cameras 52, 54 are indexed in the X-direction so that the alignment marks of two intermediate rows of alignment marks which are located between the extreme rows of alignment marks at opposite sides of the substrate 12 may be captured within the FOVs of the third and fourth cameras 52, 54.

With two additional cameras, third and fourth intermediate rows of alignment marks which are parallel to the first and second rows 30, 32 of alignment marks and located therebetween can be captured simultaneously in the same manner as that described in FIGS. 7A to 7C. The third intermediate row of alignment marks is simultaneously positioned along a relative motion path of the third camera 52 and the fourth intermediate row of alignment marks is positioned along a relative motion path of the fourth camera 54. The substrate may be moved relative to the third and fourth cameras 52, 54 along the respective relative motion paths without stopping while the third and fourth cameras capture images of multiple pairs of alignment marks from the third and fourth intermediate rows of alignment marks. The position of each cutting line can be determined from the images of each pair of alignment marks along the first and second rows 30, 32 of alignment marks together with each pair of alignment marks along the third and fourth intermediate rows of alignment marks relating to the cutting line. The positions of the cutting lines are then stored in a storage device for use during singulation. More positional information may therefore be collected along the cutting lines as compared to when two cameras are in use. As a result, more accurate determination of the orientation and positioning of the cutting lines is possible.

Figure 11:
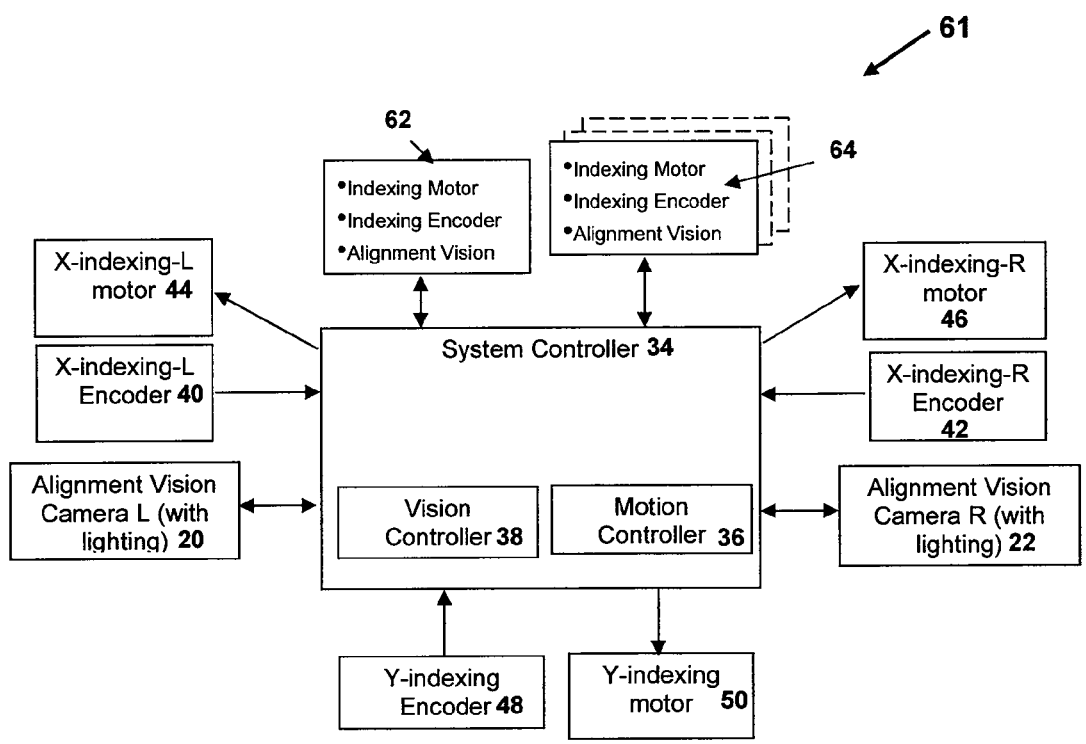
FIG. 11 shows the corresponding basic configuration of an electronic system using the singulation system with four cameras according to FIG. 10.

FIG. 11 shows the corresponding basic configuration of an electronic system 61 using the singulation system 10' with four cameras according to FIG. 10. The electronic system 61 encompasses the electronic system 34 of FIG. 9. However, it further includes a first additional set of components 62 comprising a left X-indexing motor, a left X-indexing encoder and a left alignment vision camera, and a second additional set of components 64 comprising a right X-indexing motor, a right X-indexing encoder and a right alignment vision camera for controlling the third and fourth cameras 52, 54 in the X-direction.

It should be appreciated that on-the-fly PR alignment enables positional information of alignment marks to be obtained in a shorter time and with greater accuracy. For each orientation of the substrate 12 to be cut, images of all the alignment marks at the two opposite sides of the substrate 12 are captured. This allows the orientation and position of each cutting line of each unit on the substrate 12 to be calculated and located accurately instead of by estimation. With more accurate cutting, more precise sawn unit dimensions is possible and less package offset during cutting can also be achieved.

Furthermore, the PR alignment time and the cutting cycle time are significantly reduced due to the continuous motion of the chuck table 14. Having dual cameras at the left and right spindle axes operating simultaneously reduces the PR time further as two groups of alignment marks at two opposite sides of the substrate 12 are recognized at the same time. Cycle time is significantly reduced by using the method according to the preferred embodiments such that the singulation systems 10, 10' with a single chuck table and dual cameras on-the-fly PR alignment method achieves a comparable cycle time to a singulation system with dual chuck tables. Having only a single chuck table in the singulation system also saves cost and requires less space. Additionally, if more cameras are incorporated into the system, more positional information can be collected across each row of units for alignment, and thus the calculation of the cutting lines of the corresponding row of units can be more precise.

The invention described herein is susceptible to variations, modifications and/or additions other than those specifically described and it is to be understood that the invention includes all such variations, modifications and/or additions which fall within the spirit and scope of the above description.

The invention claimed is:

1. Method of determining virtual cutting lines on a substrate prior to its singulation, the substrate comprising first and second rows of alignment marks which are parallel to each other, a pair of alignment marks each from the first and second rows of alignment marks being configured for determining a position of the virtual cutting lines on the substrate, the method comprising the steps of:

positioning the first row of alignment marks along a relative motion path of a first camera and positioning the second row of alignment marks along a relative motion path of a second camera;

moving the substrate relative to the first and second cameras along the respective relative motion paths without stopping while the first and second cameras capture images of multiple pairs of alignment marks from the first and second rows of alignment marks during such motion; and thereafter determining the position of each virtual cutting line on the substrate from the images of each pair of alignment marks along the first and second rows of alignment marks relating to the virtual cutting line on the substrate, and storing the positions of the virtual cutting lines on the substrate in a storage device for use during singulation.

2. Method as claimed in claim 1, wherein the substrate further comprises third and fourth rows of alignment marks which are parallel to each other but perpendicular to the first and second rows of alignment marks, and the method further comprises the steps of:

rotating the substrate such that the third row of alignment marks are positioned along the relative motion path of the first camera and the fourth row of alignment marks are positioned along the relative motion path of the second camera;

moving the substrate relative to the first and second cameras along the respective relative motion paths without stopping while the first and second cameras capture images of multiple pairs of alignment marks from the third and fourth rows of alignment marks during such motion; and thereafter determining the position of each virtual cutting line on the substrate from the images of each pair of alignment marks along the third and fourth rows of alignment marks relating to the virtual cutting line on the substrate, and storing the positions of the virtual cutting lines on the substrate in a storage device for use during singulation.

3. Method as claimed in claim 1, wherein the substrate is rectangular in shape, and outermost alignment marks of the first and second rows of alignment marks which are located at opposite corners of the substrate are positioned in fields of view of the first and second cameras respectively prior to moving the substrate relative to the first and second cameras.

4. Method as claimed in claim 1, wherein moving the substrate relative to the first and second cameras further comprises the steps of activating a motion controller to move the substrate relative to the first and second cameras without stopping, and to send signals to a vision controller to capture images at predetermined positions of the alignment marks along the relative motion path during such non-stop relative movement.

5. Method as claimed in claim 4, wherein the predetermined positions of the alignment marks are stored by an indexing encoder as pre-learned positions prior to determining the position of the virtual cutting lines on the substrate.

6. Method as claimed in claim 1, wherein the substrate further comprises third and fourth intermediate rows of alignment marks which are parallel to the first and second rows of alignment marks, a pair of alignment marks each from the first and second rows of alignment marks and a pair of alignment marks each from the third and fourth intermediate rows of alignment marks being configured for determining a position of the virtual cutting lines on the substrate, the method further comprising the steps of:

simultaneously positioning the third intermediate row of alignment marks along a relative motion path of a third camera and positioning the fourth intermediate row of alignment marks along a relative motion path of a fourth camera;

moving the substrate relative to the third and fourth cameras along the respective relative motion paths without stopping while the third and fourth cameras capture images of multiple pairs of alignment marks from the third and fourth intermediate rows of alignment marks during such motion; and thereafter determining the position of each virtual cutting line on the substrate from the images of each pair of alignment marks along the third and fourth intermediate rows of alignment marks relating to the virtual cutting line on the substrate, and storing the positions of the virtual cutting lines on the substrate in a storage device for use during singulation.

7. Method as claimed in claim 6, wherein the third and fourth intermediate rows of alignment marks are both located between the first and second rows of alignment marks.

8. Method as claimed in claim 6, wherein the third and fourth cameras are mounted on an indexing mount, and are mounted separately from mounts of the first and second cameras.

* * * * *